(12) United States Patent
Ikegami et al.

(10) Patent No.: US 6,376,894 B1
(45) Date of Patent: Apr. 23, 2002

(54) SEMICONDUCTOR DEVICE

(75) Inventors: Hiroshi Ikegami, Hiratsuka; Keiichi Sasaki, Yokohama; Nobuo Hayasaka, Yokosuka, all of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/525,107

(22) Filed: Mar. 14, 2000

(30) Foreign Application Priority Data

Mar. 18, 1999 (JP) ............................................. 11-073487

(51) Int. Cl.⁷ .............................................. H01L 29/00
(52) U.S. Cl. ....................................... 257/529; 257/209
(58) Field of Search ................................ 257/209, 210, 257/529; 438/281, 601

(56) References Cited

U.S. PATENT DOCUMENTS 6,163,062 A * 12/2000 Shiratake et al. ............ 257/529

FOREIGN PATENT DOCUMENTS

JP 8 321549 * 12/1996
JP 10-163331 6/1998

* cited by examiner

*Primary Examiner*—Minh Loan Tran
(74) *Attorney, Agent, or Firm*—Finnegan, Henderson, Farabow, Garrett & Dunner, L.L.P.

(57) ABSTRACT

There is provided a semiconductor device in which redundancy fuses formed in an upper layer wiring region can be cut without damaging an underlying Si substrate or adjacent regions. The semiconductor device comprises a lower layer wiring formed within an interlayer insulating film on the Si substrate, and an upper layer metal wiring made of Al, Cu or the like, formed above the lower layer wiring and connected thereto through a via metal, wherein the redundancy fuses are formed in the same wiring layer as the upper layer metal wiring. For cutting a fuse by irradiating with a laser having a wavelength in a range of 1,000 to 1,100 nm and a beam diameter D ($\mu$m), the fuse may be designed to have a film thickness T ($\mu$m) and a width W ($\mu$m) which satisfy $T \leq (-0.15 (D+2\sigma)+0.46) \exp(2W)$, where $\sigma$ ($\mu$m) is an alignment accuracy of the center of the laser beam to the center of the fuse, with the result that the fuse formed in the same wiring layer as the upper layer metal wiring can be cut without damaging the Si substrate, an adjacent fuse and the upper layer metal wiring.

8 Claims, 6 Drawing Sheets

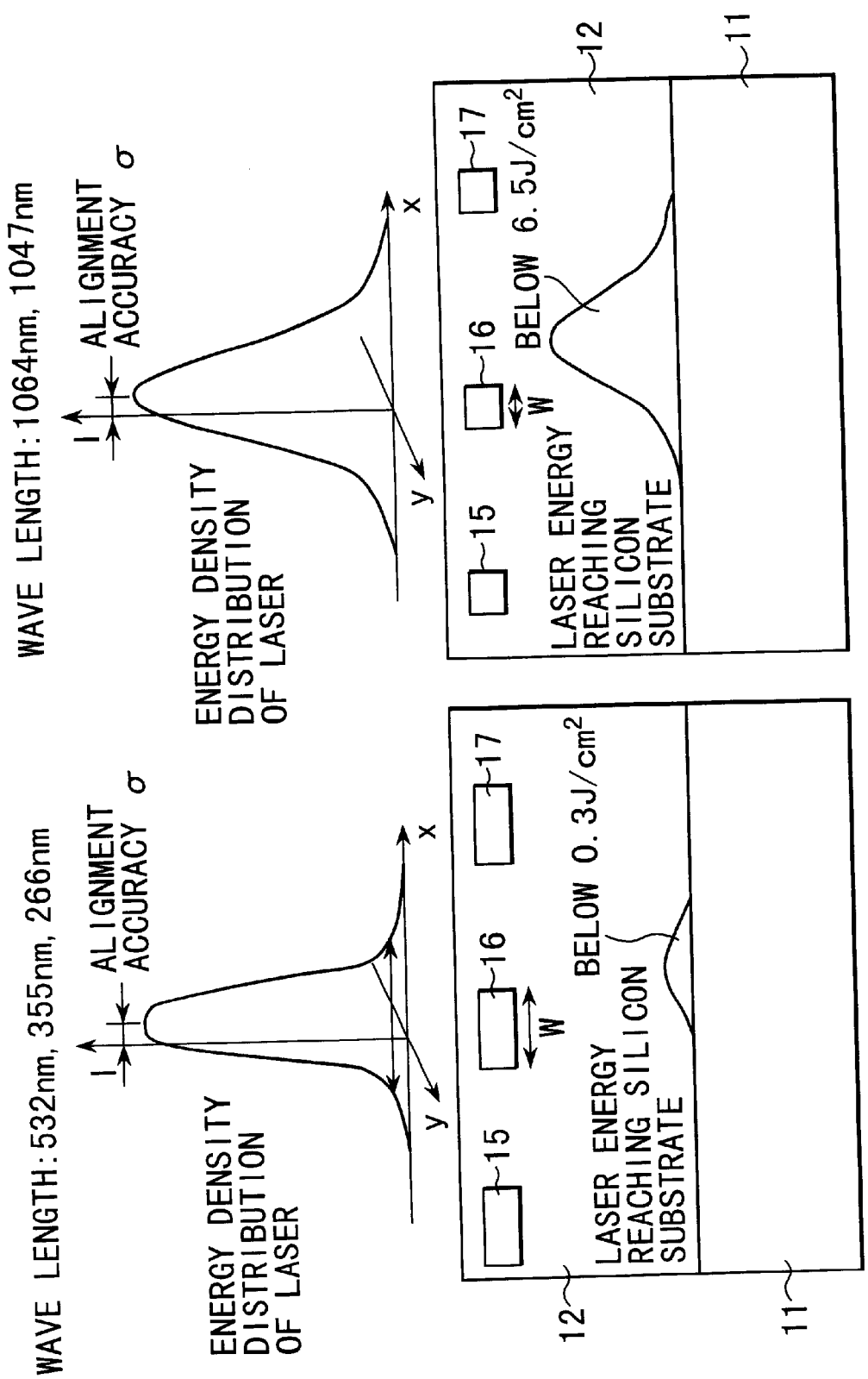

US 6,376,894 B1

SEMICONDUCTOR DEVICE

CROSS-REFERENCE TO RELATED APPLICATION

This application is based upon and claims the benefit of priority from the prior Japanese Patent Application No. 11-073487, filed Mar. 18, 1999, the entire contents of which are incorporated herein by reference.

BACKGROUND OF THE INVENTION

The present invention relates to a redundancy technology, and more particularly to a semiconductor device having fuses for laser repair.

With a further increase in the number of elements integrated on a semiconductor chip, some semiconductor devices employ a redundancy technology for saving a fault chip by replacing fault generated cell elements with spare elements.

For the switching to spare elements, a laser-based fuse cutting method is employed because of a smaller occupation area of a circuit associated therewith, and a relatively large degree of design freedom.

At present, fuses used for the redundancy technology are formed in a lower wiring layer, in which the fuses can be reduced in film thickness, for facilitating the cutting of the fuses by a laser. However, it is desired to form fuses in an upper wiring layer for reasons discussed below.

FIGS. 1A and 1B show a mutual relationship of occupation areas of fuses when the fuses are cut using a lower wiring layer and an upper wiring layer, respectively. In FIGS. 1A and 1B, reference numeral 81 designates a Si substrate; 82 an interlayer insulating film; 83 a lower layer wiring; 84 a fuse formed in the same layer as the lower layer wiring 83; 85 an upper layer wiring; and 86 a fuse formed in the same layer as the upper layer wiring 85.

As shown in FIGS. 1A and 1B, it can be seen that the fuse 84 formed in the same layer as the lower layer wiring 83 results in a significant limitation to an area available for forming other wiring in an upper layer above the fuse 84, as compared with the fuse 86 formed in the same layer as the upper layer wiring 85.

However, currently, the lower wiring layer 83 has a film thickness of approximately 300 nm or less, whereas the upper wiring layer 85 has a film thickness in a range of 400 nm to 1,600 nm, so that it is necessary to cut such thick fuses in order to form fuses in the upper wiring layer. Thicker fuses lead to problems such as a significant increase in laser energy required to cut the fuses, and more frequent occurrence of irradiation damages to regions other than a target fuse such as cutting a Si substrate, an adjacent fuse or the like.

In addition, with the miniaturization and higher integration of semiconductor devices, the miniaturization of fuses is also under progress. In order to employ miniature fuses, a shorter wavelength laser must be used to improve a focusing limit of a laser beam.

However, as shown in FIG. 2, the absorption coefficient of the laser beam for Si exhibits a significant increase in a region of wavelength below approximately 1,100 nm. In other words, a laser beam having a shorter wavelength resulting from a reduced beam diameter would cause a Si substrate underlying a fuse to be subjected to irradiation damages of the laser beam.

As described above, while a laser beam with a shorter wavelength has the advantage of improving the focusing limit of the beam diameter, it also has the disadvantage of a lower threshold energy with which the laser beam may cause an irradiation damage to a Si substrate. It is therefore necessary to provide a design for fuses with respect to the laser wavelength and beam diameter optimum for forming the fuses in a thick metallic film layer in deep consideration of such advantage and disadvantage as mentioned above. At present, however, no solution to the necessity has not been found.

BRIEF SUMMARY OF THE INVENTION

As described above, fuses, when formed in an upper wiring layer, will have a larger film thickness. A thicker fuse leads to problems such as a significant increase in laser energy required to cut the fuse, and more frequent occurrence of irradiation damages to regions other than the fuse to be cut, such as cutting a Si substrate or an adjacent fuse.

On the other hand, while a laser beam with a shorter wavelength is advantageous in improving the focusing limit of the beam diameter, it also causes a problem of reducing the threshold energy with which the laser beam may cause an irradiation damage to a Si substrate.

It is an object of the present invention to provide a semiconductor device which is capable of reducing irradiation damages to regions other than a fuse to be cut, such as, for example, an underlying Si substrate or adjacent fuses other than the fuse to be cut, even when a thick fuse used for the redundancy technology is cut, or a fuse is cut using a laser with a wavelength of 1,100 nm or less.

To achieve the above object, a semiconductor device according to the present invention is configured in the following manner.

Specifically, in a semiconductor device of the present invention in which a redundancy fuse is formed above the lowest wiring layer, and the fuse is cut by irradiating with a laser having a wavelength in a range of 1,000 nm to 1,100 nm and a beam diameter D ($\mu$m), the fuse has a film thickness T ($\mu$m) and a width W ($\mu$m) which satisfy:

$$T \leq (-0.15(D+2\sigma)+0.46) \exp(2W)$$

Where $\sigma$ ($\mu$m) is an alignment accuracy of the center of the laser beam to the center of the fuse (this designation of the symbol is also applied below).

In another aspect, in a semiconductor device of the present invention in which a redundancy fuse is provided which is cut by irradiating with a laser having a wavelength equal to or less than 600 nm and a beam diameter D ($\mu$m), the fuse has a width W ($\mu$m) which satisfies:

$$W \geq D + 2\sigma$$

Preferably, the fuse has a film thickness T equal to or larger than 400 nm.

Also preferably, the fuse is formed in a wiring layer other than the lowest wiring layer.

Further preferably, the fuse is formed in the top layer or in a layer immediately below the top layer.

The fuse is formed in the same layer as a wiring layer formed of a metal material such as Al or Cu, and the fuse is formed of the same metal material as the wiring layer in the same layer, formed of Al, Cu or the like.

With the above configuration, the present invention provides the following operations and effects.

In the case of a fuse to be cut using a laser having a wavelength in a range of 1,000 nm to 1,100 nm and a beam diameter D ($\mu$m), the fuse may be formed to have a film thickness T ($\mu$m) and a width W ($\mu$m) which satisfy:

$$T \leq (-0.15(D+2\sigma)+0.46) \exp(2W)$$

Where σ (μm) is an alignment accuracy of the center of the laser beam to the center of the fuse, with the result that the fuse can be cut without giving any irradiation damage to regions other than the fuse to be cut, such as a Si substrate or an adjacent fuse.

A laser having a wavelength in an infrared region from 1,000 nm to 1,400 nm is currently used for cutting a redundancy fuse. When a laser having a wavelength of 600 nm and a beam diameter D (μm) is used to cut a fuse, the fuse may be formed to have a width W (μm) which satisfies:

$$W \geq D+2\sigma$$

with the result that the fuse can be cut without giving any irradiation damage to regions other than the fuse to be cut, such as a Si substrate or an adjacent fuse. Therefore, a beam focusing limit can be improved, and fuses formed at narrower pitches can be employed.

At present, fuses have a film thickness of approximately 300 nm or less since fuses are formed in a lower layer. However, a fuse having a film thickness of 400 nm or more can be cut under the foregoing equation. A fuse is formed in an upper layer, thus, area penalty due to the fuse can be reduced.

Also, while fuses are currently formed of the same material as a lower layer wiring which is made of such materials as silicon polycrystal or tungsten silicide, it is possible, according to the present invention, to cut a fuse made of Al, Cu or the like in an upper layer.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 5A and 5B are characteristic curves showing the dependency on the wavelength of a laser energy condition required to prevent laser irradiation damages to a Si substrate;

DETAILED DESCRIPTION OF THE INVENTION

Hereinafter, an embodiment of the present invention will be described with reference to the accompanying drawings.

Figure 3:
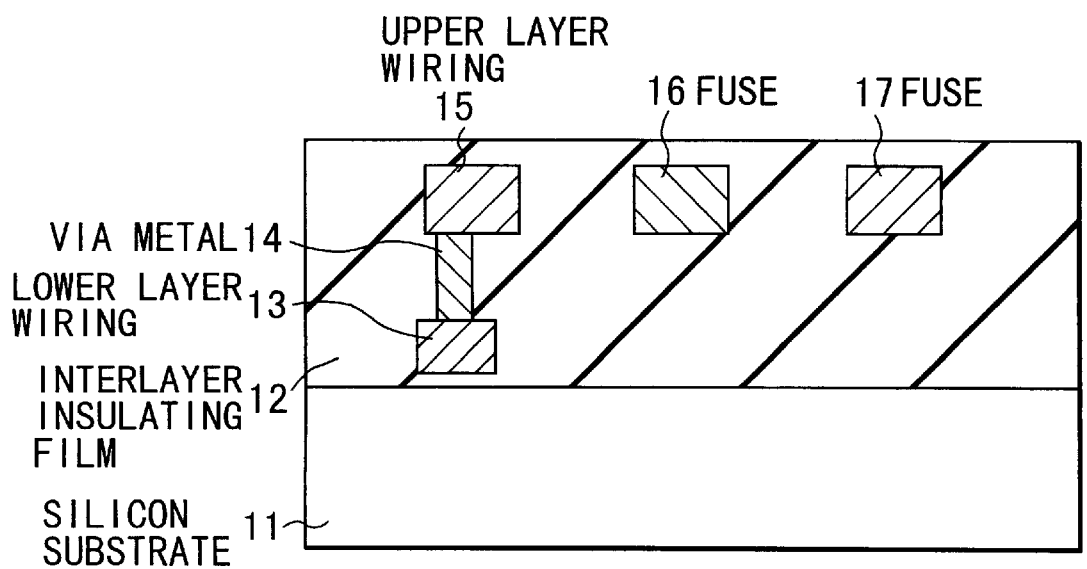
FIG. 3 is a cross-sectional view showing the structure of a semiconductor device according to one embodiment of the present invention.

FIG. 3 is a cross-sectional view showing the structure of a semiconductor device according to a first embodiment of the present invention. A lower layer wiring 13 is formed within an interlayer insulating film 12 formed on a Si substrate 11. Above the lower layer wiring 13, an upper layer wiring 15 made of Al, Cu or the like is formed through a via metal 14. In the same layer as the upper layer wiring 15, fuses 16, 17 for redundancy are formed.

Assuming that the fuse 16 is cut by irradiating with a laser having a wavelength in a range of 1,000 nm to 1,100 nm and a beam diameter D (μm), the fuse 16 is formed such that its film thickness T (μm) and width W (μm) satisfy the following condition:

$$T \leq (-0.15(D+2\sigma)+0.46) \exp(2W) \qquad (1)$$

Where σ (μm) is an alignment accuracy of the center of the laser beam to the center of the fuse 16.

Alternatively, assuming that the fuse 16 is cut by irradiating with a laser having a wavelength of 600 nm or less and the beam diameter D (μm), the fuse 16 is formed such that its width W (μm) satisfies the following condition:

$$W \geq D+2\sigma \qquad (2)$$

By forming the fuse 16 so as to satisfy the condition defined by equation (1) or (2), it is possible to suppress damages due to the irradiated laser to other regions such as the Si substrate 11, an adjacent fuse 17 and the upper layer wiring 15 when the fuse 16 is cut by irradiating with the laser.

Next, description will be given on the reason for which damages due to the irradiated laser can be suppressed by satisfying the condition defined by equation (1) or (2).

First, when the fuse 16 was cut by laser irradiation, observation was made on the energy required for the cutting, and irradiation damages to the Si substrate 11. Then, the fuse 16 was evaluated with the film thickness T in a range of 400 nm to 1,600 nm and the width W in a range of 0.1 μm to 1.5 μm.

Lasers used for cutting were $Nd^{3+}$YLF laser (wavelength of 1,047 nm); $Nd^{3+}$YAG laser (wavelength of 1,064 nm); $Nd^{3+}$YAG second harmonic (wavelength of 532 nm); $Nd^{3+}$ third harmonic (wavelength of 355 nm); and $Nd^{3+}$ fourth harmonic (wavelength of 266 nm). Every laser was set to have a pulse width in a range of 5 to 10 nsec. Also, the alignment accuracy of the center of the fuse 16 to be cut to the center of the laser beam was ±2 μm in a machine used to cut fuses.

Figure 4A:
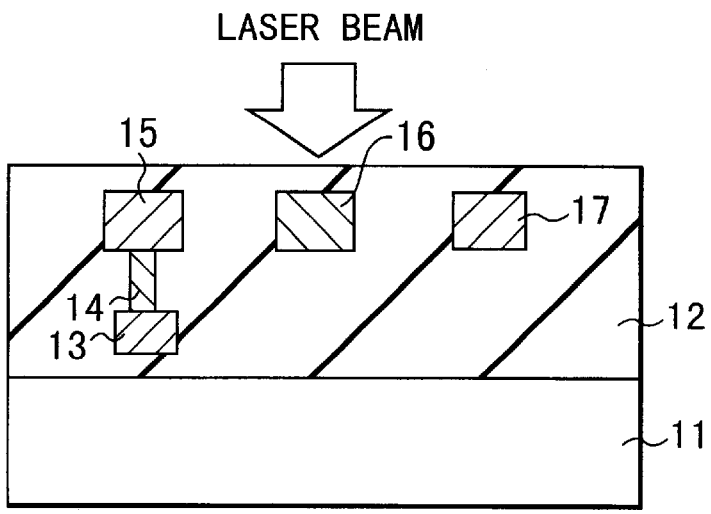
FIGS. 4A and 4B are cross-sectional views showing steps of cutting a fuse shown in FIG. 3.
Figure 4B:
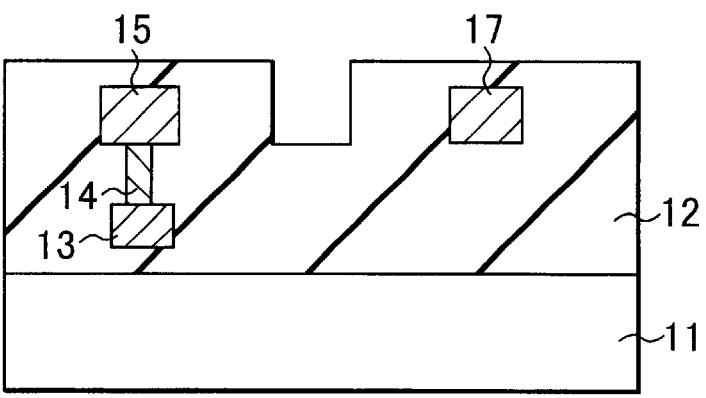

FIGS. 4A and 4B are cross-sectional views showing steps of cutting the fuse 16 shown in FIG. 3. As shown in FIG. 4A, a laser is irradiated toward the interlayer insulating film 12 above the fuse 16 to be cut. Then, the fuse 16 is cut by heat generated by the laser irradiation, as shown in FIG. 4B.

When the fuse 16 is cut, the electric resistance of the cut fuse 16 is measured to find the laser energy required to cut the fuse 16. At this time, it is determined that the resistance of the cut fuse 16 must be increased by six figures or more as compared with the initial resistance. Also, laser irradiation damages to the Si substrate 11, the adjacent upper layer wiring 15 and the adjacent fuse 17 are evaluated by observing the cross-sectional structure with SEM (Scanning Electron Microscope).

FIGS. 5A and 5B show the dependency on the wavelength of a laser energy condition required to prevent laser irradiation damages to the Si substrate 11. As shown in FIG. 5A, when using short wavelength lasers at wavelengths of 532 nm, 355 nm and 266 nm, respectively, it can be seen that the laser energy reaching the Si substrate 11 must be suppressed to 0.3 J/cm$^2$ or less.

Also, as shown in FIG. 5B, when using lasers at wavelengths of 1,064 nm and 1,047, respectively, it can be seen that the Si substrate 11 does not suffer from any laser irradiation damage even if it is irradiated with a laser having the energy up to 6.5 J/cm$^2$. The foregoing results show that as the laser has a shorter wavelength, the Si substrate 11 easily receives laser irradiation damages.

Figure 1A:
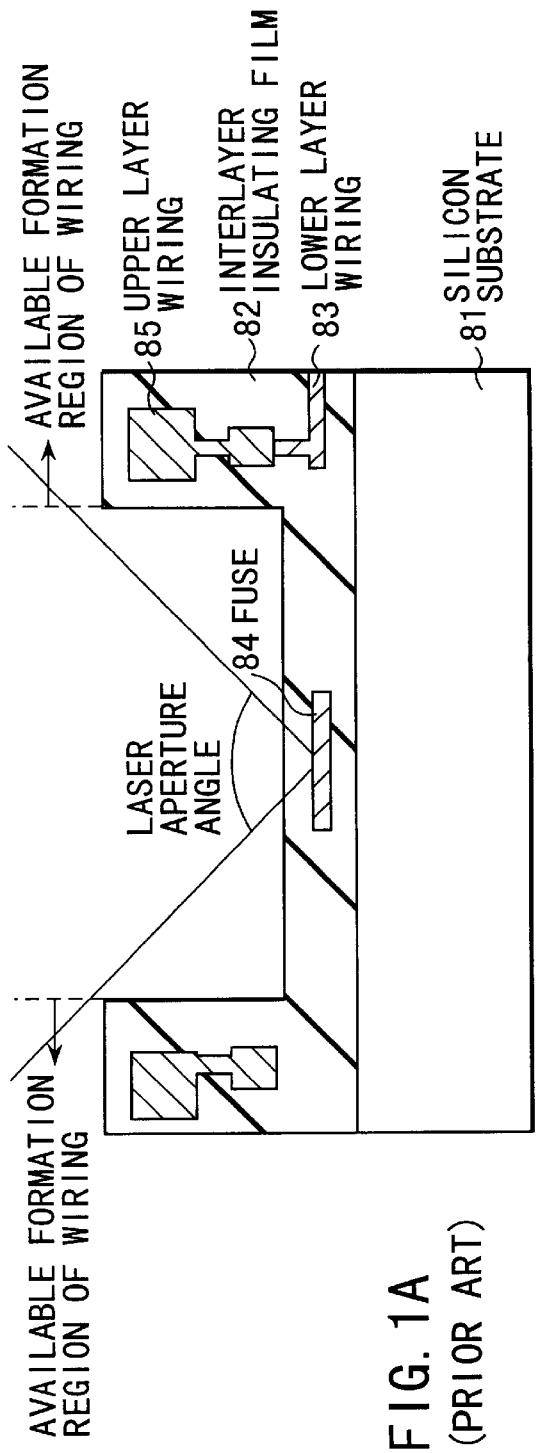
FIGS. 1A and 1B are diagrams showing a mutual relationship of occupation areas of fuses when the fuses are cut using a lower wiring layer and an upper wiring layer, respectively.
Figure 1B:
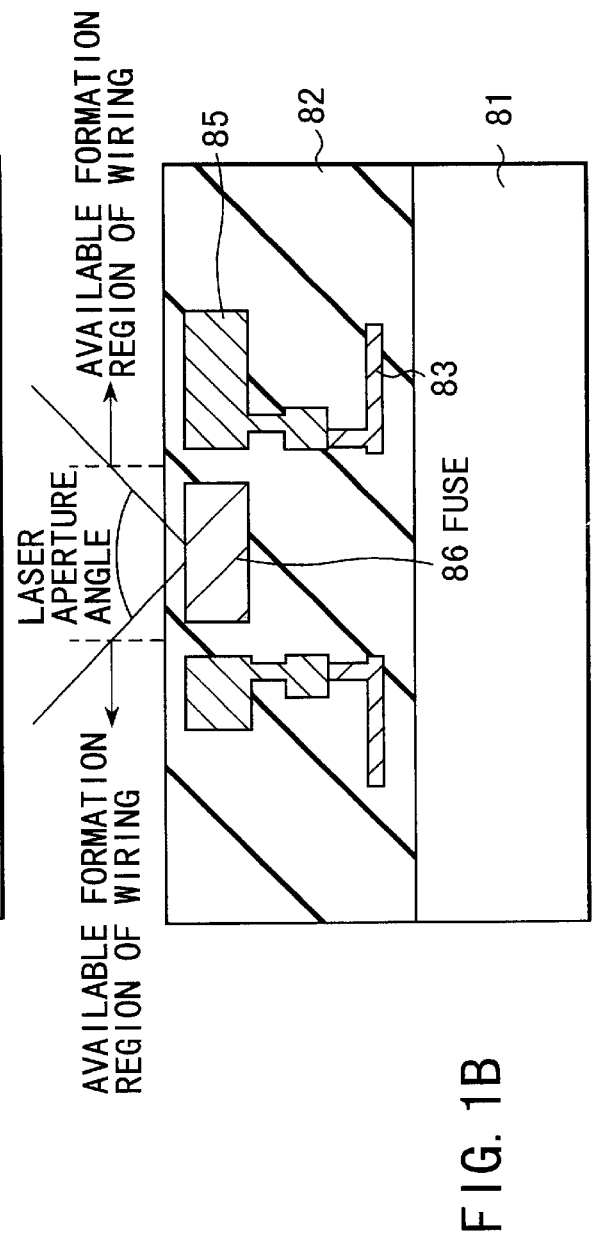
Figure 2:
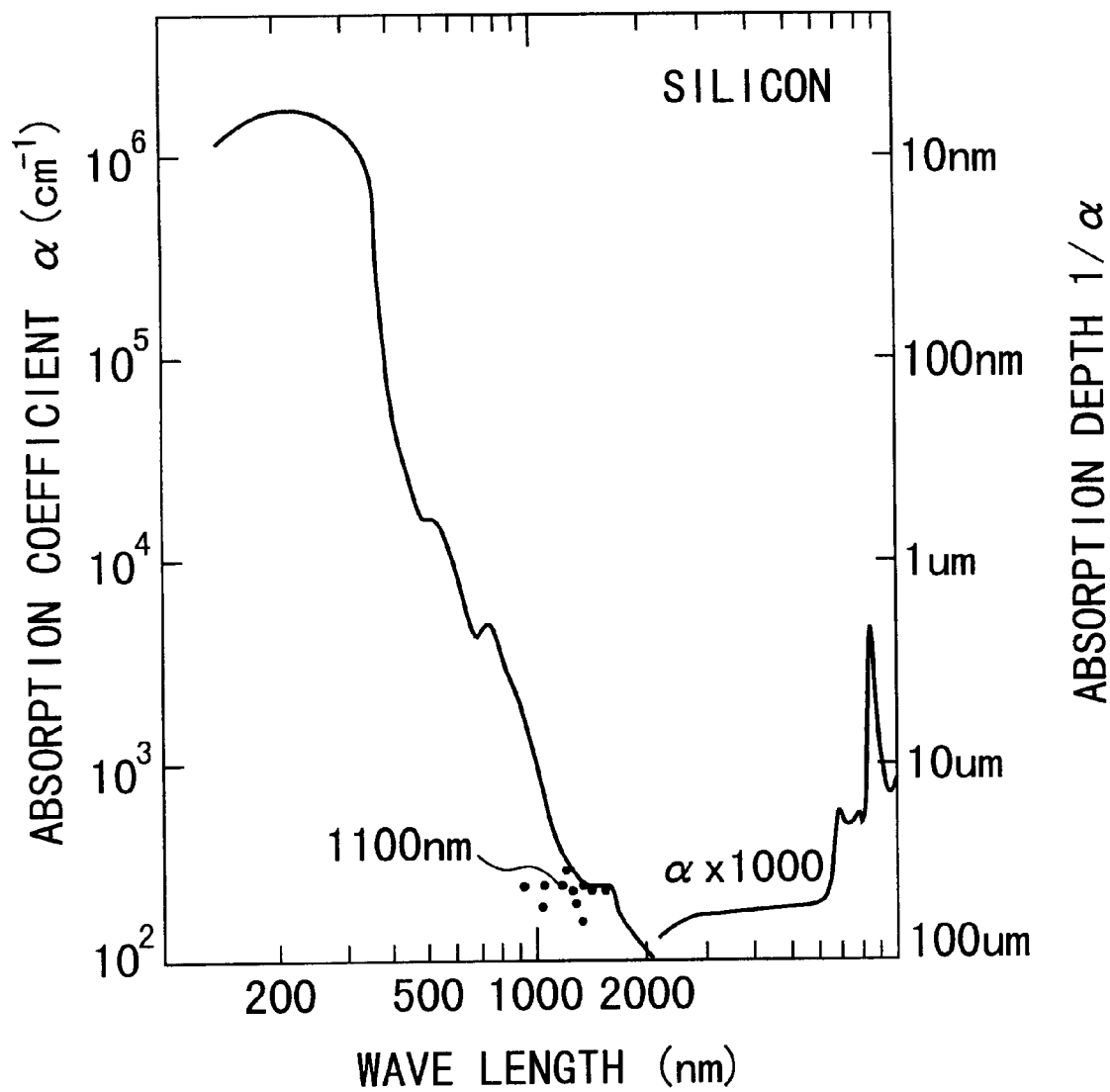
FIG. 2 is a characteristic curve showing the dependency on the wavelength of the laser absorption coefficient for Si.

As previously described referring to FIG. 2, the laser absorption coefficient of Si exhibits a significant increase as the wavelength is shorter. The value of the laser absorption coefficient is 600 cm$^{-1}$ at 1,064 nm; 750 cm$^{-1}$ at 1,047 nm; $2 \times 10^4$ cm$^{-1}$ at 532 nm; $8 \times 10^5$ cm$^{-1}$ at 355 nm; and $1.5 \times 10^6$ cm$^{-1}$ at 266 nm. In other words, the absorption depths into Si at the respective wavelengths are 17 $\mu$m, 14 $\mu$m, 0.5 $\mu$m, 12 nm and 7 nm, respectively.

It is considered that the energy which can be irradiated to the Si substrate 11 by the irradiation of the lasers at wavelength of 1,047 nm and 1,064 becomes sufficiently larger as compared with lasers at wavelength of 532 nm or less because the absorption depths of the Si become larger than those of the shorter wavelength lasers, so that the laser energy widely distributes down into the Si substrate 11.

Since the lasers used in this case have a pulse width in a range of 5 to 10 nsec, the thermal diffusion length of the Si substrate 11 during the laser irradiation is approximately 1 $\mu$m. On the other hand, lasers at wavelength of 600 nm or less exhibit laser absorption depths of 1 $\mu$m or less, which is shorter than the thermal diffusion length. Therefore, it can be thought that the irradiation of a laser at wavelength of 600 nm or less will cause, in approximation, the laser energy to be accumulated in a region of the Si substrate 11 down to the depth of approximately 1 $\mu$m during the laser irradiation. On the other hand, a laser at wavelength of 1,000 nm to 1,100 nm exhibits a laser absorption depth in a range of 10 $\mu$m to 20 $\mu$m. Since the absorption depth is sufficiently larger as compared with the thermal diffusion length, the energy is accumulated in a region of the Si substrate 11 down to the laser absorption depth.

A temperature distribution within the Si substrate 11 in this case is approximately expressed by the following equation:

$$F/\beta(1-R) \exp(-z/\beta) = C_v \times \Delta T \quad (3)$$

where $\beta$ is the energy accumulation depth (10 to 20 $\mu$m at 1,000 to 1,100 nm; 1.0 $\mu$m at 600 nm or less), F is the laser energy density, R is the reflectivity, z is the depth from the surface of the Si substrate 11, Cv is the constant volume specific heat, and $\Delta T$ is an increase in temperature.

It is estimated from equation (3) that the surface temperature of the Si substrate 11 rises up to approximately 1,000° C. when the Si substrate 11 is irradiated with a laser having a wavelength of 600 nm or less and a laser energy density of 0.3 J/cm$^2$ which does not cause damages to the Si substrate 11. It is also estimated that the temperature rises up to approximately 1,000° C. to 1,400° C. when the Si substrate 11 is irradiated with a laser having a wavelength of 1,064 nm or 1,047 nm and an energy density of 6.5 J/cm$^2$ which does not cause damages to the Si substrate 11. From the fact that the melting point of the Si is 1,410° C., and both the estimated temperatures is below the melting point, it is thought that the surface temperature of the Si substrate 11 immediately after the laser irradiation must be maintained at the melting point or lower in order to prevent laser irradiation damages to the Si substrate 11.

Figures 6A, 6B:
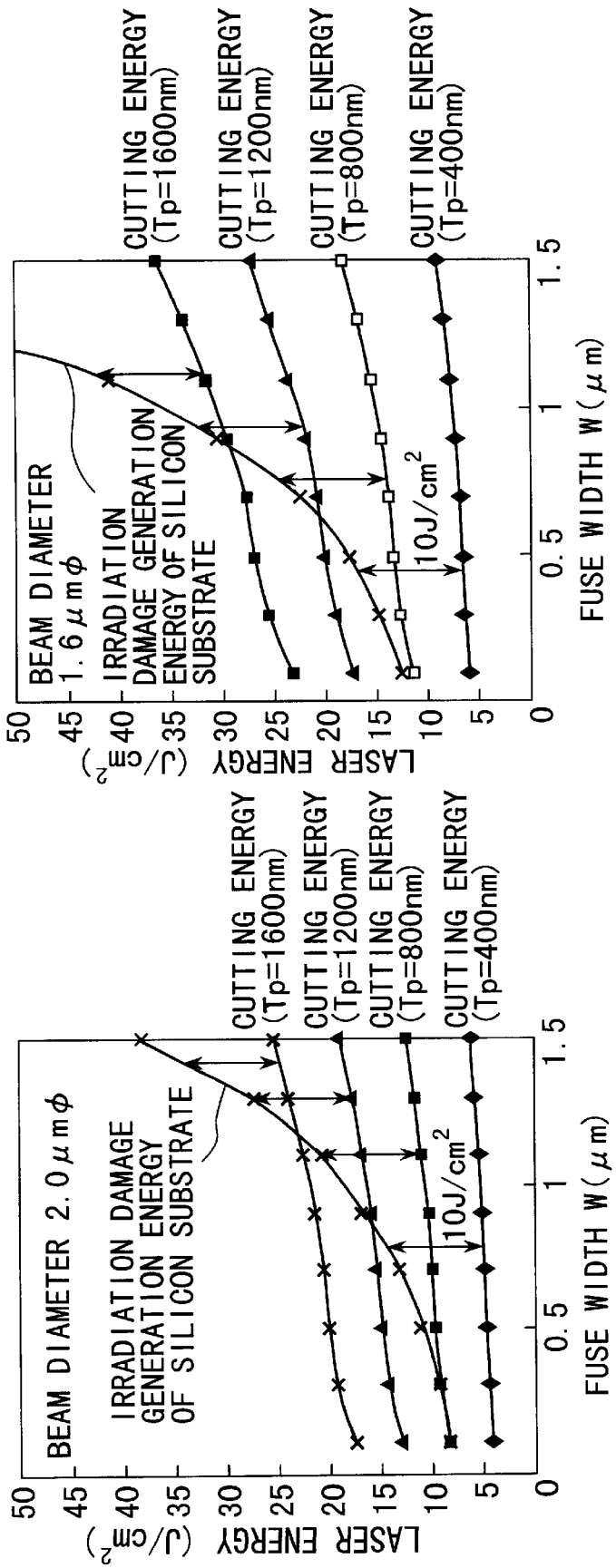
FIGS. 6A and 6B are graphs each showing the laser energy which may cause irradiation damages to a Si substrate when fuses are cut using lasers having a beam diameter of 2.0 μmφ and 1.6 μmφ and a wavelength in a range of 1,000 nm to 1,100 nm, respectively.

As will be later discussed in detail, laser irradiation damages to the Si substrate 11 largely differ between when a laser at wavelength of 600 nm or less is used and when a laser at wavelength of 1,000 nm to 1,100 nm is used. In the following, description will be given on conditions required to cut a fuse while preventing the Si substrate 11 from damages, derived from the relationship between the cutting of a fuse and damages to the Si substrate 11, when a laser at wavelength of 1,000 nm to 1,100 nm is used and when a laser at wavelength of 600 nm or less is used. (1) A case in which laser at Wavelength of 1,000 nm to 1,100 nm is used:

FIGS. 6A and 6B show the laser energy which generates irradiation damages to a Si substrate when a fuse is cut using lasers having a wavelength of 1,000 nm to 1,100 nm and a beam diameter of 2.0 $\mu$m$\phi$ and 1.6 $\mu$m$\phi$. FIGS. 6A and 6B also show the laser energy required to cut fuses of 400 nm, 800 nm, 1,200 nm and 1,600 nm in film thickness, respectively.

It has been said that there must be a difference of at least 10 J/cm$^2$ or more between the energy to cut a fuse and the energy causing damages to the Si substrate 11 in consideration of variations in film thickness of the fuse and the stability of the laser energy. More specifically, for cutting fuses of 400 nm, 800 nm, 1,200 nm and 1,600 nm in film thickness using a laser having a beam diameter of 2.0 $\mu$m$\phi$, the fuses must be made to have a width of 0.75 $\mu$m, 1.1 $\mu$m, 1.3 $\mu$m and 1.4 $\mu$m or more, respectively. Also, when the beam diameter is set to be 1.6 $\mu$m$\phi$, the fuses of the respective film thicknesses must be made to have the width of 0.45 $\mu$m, 0.75 $\mu$m, 0.9 $\mu$m and 1.1 $\mu$m or more, respectively.

Figure 7:
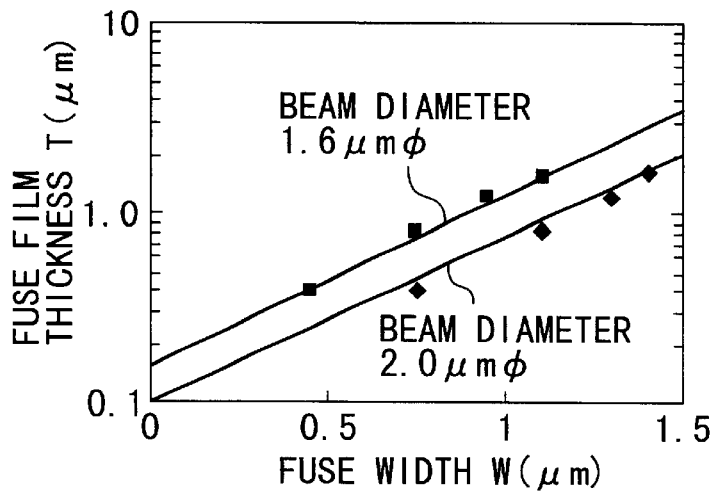
FIG. 7 is a graph showing the width of a fuse which is minimally required when the fuse having a certain film thickness is cut.

FIG. 7 shows the width W ($\mu$m) minimally required to cut a fuse having a certain film thickness T ($\mu$m). It can be seen from FIG. 7 that the relationship between a certain fuse film thickness and a minimally required fuse width can be substantially linearly approximated on a semilogarithmic plot. Since the slope of these straight lines is two, the solid lines in FIG. 7 can be expressed by the following equation:

$$T = A \exp(2W) \quad (4)$$

where A is the intercept of FIG. 7 which is 0.16 $\mu$m and 0.1 $\mu$m for beam diameters of 1.6 $\mu$m$\phi$ and 2.0 $\mu$m$\phi$, respectively. Further, with a beam diameter of 1.8 $\mu$m$\phi$, A is found to be 0.13 $\mu$m. In other words, A ($\mu$m) can be expressed by the following equation using the beam diameter D ($\mu$m) and the alignment accuracy $\sigma$ ($\mu$m):

$$A = -0.15(D + 2\sigma) + 0.46 \quad (5)$$

The relationship between the width W and the film thickness T of a fuse expressed by equations (4) and (5) is shown by the solid lines in FIG. 7. The solid lines and the plots indicating the experiment result exhibit good coincidence within a range of ±10%. It is therefore possible to cut a fuse having a certain film thickness T without damaging the Si substrate 11 by setting the width W of the fuse to satisfy the following equation, when the fuse is cut using a laser having a beam diameter D:

$$T \leq (-0.15(D+2\sigma) + 0.46) \exp(2W) \quad (6)$$

Figure 8A:
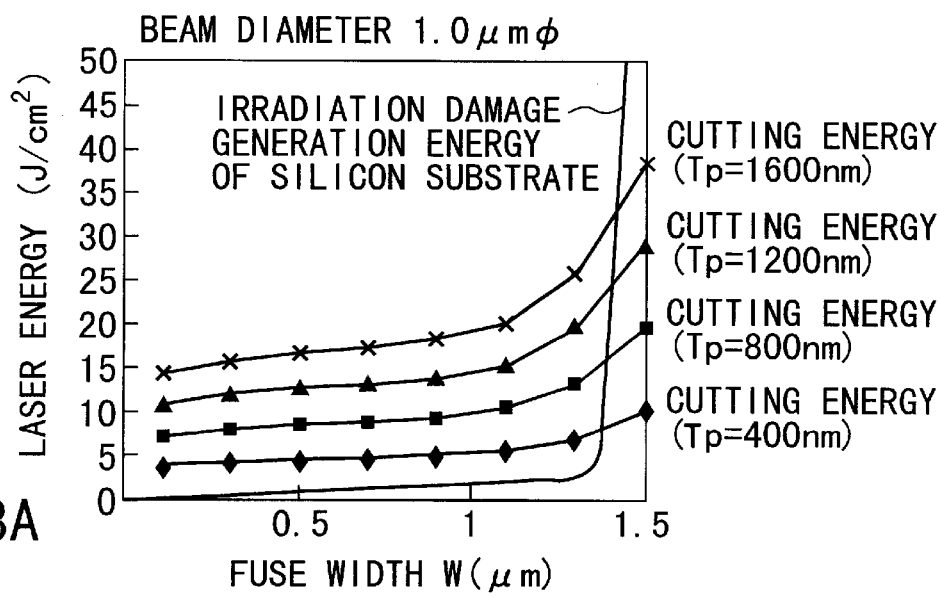
FIGS. 8A and 8B are graphs each showing the relationship between the energy required to cut a fuse and the energy causing a damage to a Si substrate.
Figure 8B:
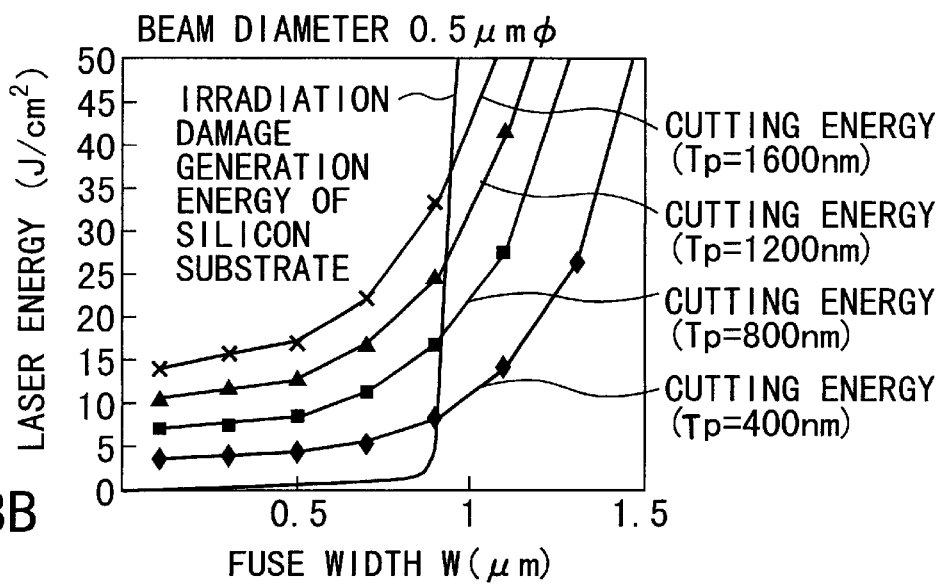

While conventional fuses have a film thickness of approximately 300 nm or less, the equations proposed in the present invention can provide largely thicker fuses which can be cut by use of a laser at wavelength from 1,000 nm to 1,100 nm, as well as suppress laser damages to the Si substrate 11, adjacent upper layer wiring 15, and adjacent fuse. (2) A case in which laser at Wavelength of 600 nm or Less is used:

FIGS. 8A and 8B show the relationships between the energy required to cut fuses and the energy causing damages to the Si substrate when the fuses are cut using lasers having a beam diameter of 1.0 µmφ and a beam diameter of 0.5 µmφ, respectively, at wavelength of 532 nm, 355 nm and 266 nm.

It can be seen from FIGS. 8A and 8B that the laser energy of several J/cm² or more is required to cut fuses. On the other hand, as previously explained referring to FIG. 5, the laser energy reaching the Si substrate 11 must be suppressed to 0.3 J/cm² or less when a laser at wavelength of 600 nm or less is used. In this way, when a laser in a short wavelength region is used, the energy required to cut a fuse is sufficiently larger than the energy causing damages to the Si substrate 11.

Therefore, the laser energy must be completely shielded by a fuse to be cut in order to cut the fuse without causing any irradiation damage to the Si substrate 11. In other words, assuming that the alignment accuracy of the center of the laser beam to the center of the fuse is σ (µm), the width W (µm) of the fuse required to use a laser having a beam diameter D (µm) is given by:

$$W \geq D + 2\sigma \quad (7)$$

Since the machine used in the present evaluation has an alignment accuracy of 0.2 µm, the widths W of fuses required to use lasers having a beam width of 1.0 µm and 0.5 µm are calculated to be 1.4 µm and 0.9 µm, respectively, from the foregoing equation (7).

The experiment results shown in FIGS. 8A and 8B also show that the laser energy causing irradiation damages to the Si substrate 11 exhibits abrupt increases from the fuse widths of 1.4 µm and 0.9 µ, respectively, when lasers having a beam width of 1.0 µm and 0.5 µm are used. It is therefore understood that the graphs of FIGS. 8A and 8B show good coincidence with the results derived from equation (7).

In other words, when a laser at wavelength of 600 nm or less is used, the width of the fuse 16 may be set to satisfy the relationship expressed by equation (7), with the result that the fuse 16 can be cut without damaging the Si substrate 11 or regions adjacent to the fuse 16.

It should be noted that the present invention can not be limited to the foregoing embodiment. For example, while the fuses are formed in the top wiring layer, the formation of fuses is not limited to the top layer. However, since fuses formed in a lower wiring layer result in a significant limitation to an area available for forming other wiring in layers above the fuses, the fuses are preferably formed in the top layer or in a wiring layer immediately below the top layer.

Otherwise, the present invention can be implemented in a variety of modifications without departing from the spirit and scope thereof.

According to the present invention as described above, irradiation damages to regions other than a fuse to be cut, such as an underlying Si substrate and an adjacent fuse can be suppressed even for cutting a fuse formed in a thick film in use for the redundancy technology, or for cutting a fuse using a laser at wavelength of 1,100 nm or less.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device having a fuse for redundancy, the fuse being cut by irradiating with a laser having a wavelength in a range of 1,000 nm to 1,100 nm and a beam diameter D (µm), wherein the fuse has a film thickness T (µm) and a width W (µm) which satisfy:

$$T \leq (-0.15(D+2\sigma)+0.46)\exp(2W)$$

where σ (µm) is an alignment accuracy of the center of the laser beam to the center of the fuse.

2. A semiconductor device according to claim 1, wherein the fuse has a film thickness T equal to or larger than 400 nm.

3. A semiconductor device according to claim 1, wherein the fuse is formed in a wiring layer other than the lowest wiring layer.

4. A semiconductor device according to claim 3, wherein the fuse is formed in the same layer as a wiring layer formed of a metal material, and is formed of the same metal material as the wiring layer.

5. A semiconductor device having a fuse for redundancy, the fuse being cut by irradiating with a laser having a wavelength equal to or less than 600 nm and a beam diameter D (µm), wherein the fuse has a width W (µm) which satisfies:

$$W \geq D + 2\sigma$$

where σ (µm) is an alignment accuracy of the center of the laser beam to the center of the fuse.

6. A semiconductor device according to claim 5, wherein the fuse has a film thickness T equal to or larger than 400 nm.

7. A semiconductor device according to claim 5, wherein the fuse is formed in a wiring layer other than the lowest wiring layer.

8. A semiconductor device according to claim 7, wherein the fuse is formed in the same layer as a wiring layer formed of a metal material, and is formed of the same metal material as the wiring layer.

* * * * *